United States Patent [19]

Yoneda

[11] Patent Number: 5,453,948
[45] Date of Patent: Sep. 26, 1995

[54] ASSOCIATIVE MEMORY

[75] Inventor: Masato Yoneda, Tokyo, Japan

[73] Assignee: Kawasaki Steel Company, Hyogo, Japan

[21] Appl. No.: 296,462

[22] Filed: Aug. 26, 1994

[30] Foreign Application Priority Data

Aug. 31, 1993 [JP] Japan ................. 5-216424
Apr. 21, 1994 [JP] Japan ................. 6-083395

[51] Int. Cl.$^6$ ............................. G11C 15/00; G11C 7/00
[52] U.S. Cl. ................. 365/49; 365/204; 365/203; 365/227
[58] Field of Search ............... 365/49, 203, 204, 365/189.07, 227

[56] References Cited

U.S. PATENT DOCUMENTS

| | | | |
|---|---|---|---|
| 4,862,412 | 8/1989 | Fried et al. ................. | 365/49 |
| 4,991,136 | 2/1991 | Mihara ................. | 365/49 |
| 5,126,968 | 6/1992 | Hamamoto et al. ................. | 365/49 |
| 5,257,220 | 10/1993 | Shin et al. ................. | 365/49 |

*Primary Examiner*—David C. Nelms
*Assistant Examiner*—Tan Nguyen
*Attorney, Agent, or Firm*—Oliff & Berridge

[57] ABSTRACT

There is disclosed an associative memory capable of reducing electricity to be consumed. Prior to a retrieval, a number of match lines, which associate with a number of word memories, respectively, are precharged. In the retrieval, among the multiple match lines which are subjected to the precharge, the match line associated with the word memory which stores a bit pattern equivalent to that for the retrieval is discharged.

7 Claims, 8 Drawing Sheets

ASSOCIATIVE MEMORY

BACKGROUND OF THE INVENTION

1. Field of the Invention

The present invention relates to a content addressable memory or an associative memory comprising a number of word memories each for storing a bit pattern in units of words, and having such a function that retrieval data are inputted to the word memories and word memories, which have stored data having the same bit pattern as that of the retrieval data in its entirety or in a part specified, are retrieved.

2. Description of the Related Art

Recently, there has been proposed an associative memory provided with the retrieval function as mentioned above.

FIG. 6 is a circuit block diagram of the conventional associative memory by way of example.

Referring to FIG. 6, an associative memory 10 is provided with a number of word memories 11a, 11b, ..., 11n each consisting of a 5-bit of serial memory cell. Further, the associative memory 10 comprises a retrieval register 12 which is adapted to receive and latch a word of retrieval data. A bit pattern of the retrieval data latched in the retrieval register 12 in its entirety or in a part specified is compared with a bit pattern of the portion corresponding to the bit pattern of the latched retrieval data with respect to data stored in each of the word memories 11a, 11b, ..., 11n. As a result of the comparison, if there are found any of the word memories 11a, 11b, ..., 11n of which the bit pattern matches with that of the retrieval data, a match signal given by a logic "1" (here 5.0 volt) will appear on the associated ones of match lines 14a, 14b, ..., 14n which are provided in conjunction with the word memories 11a, 11b, ..., 11n, respectively. On the other hand, a mismatch signal given by a logic "0" (here 0.0 volt) will appear on the remaining ones of the match lines 14a, 14b, ..., 14n.

Assuming that the signals "0", "1", "0", "0", "1"..., "0" appear on the flag lines 14a, 14b, ..., 14n, respectively, these signals are applied to a priority encoder 15. The priority encoder 15 is so arranged to output an address signal AD corresponding to the match line given with a highest priority among the match lines (here, the match lines 14b and 14e) on which the match signal given by a logic "1" appears. Supposing that the priority is higher as alphabet of a suffix of the reference character becomes younger, in this case, the match line 14b is selected as the highest priority match line. Thus, the priority encoder 15 outputs an address signal AD corresponding to the highest priority match line 14b, which address signal AD is applied to an address decoder 16, in accordance with the necessity. The address decoder 16 decodes the received address signal AD and outputs an access signal (here a signal given by a logic "1") to the associated one (here a word line 17b) of word lines 17a, 17b, ..., 17n which are provided in conjunction with the word memories 11a, 11b, ..., 11n, respectively. Thus, data stored in the word memory 11b associated with the word line 17b on which the access signal appears is read out to an output data register 18.

As described above, according to the associative memory 10, the contents or data stored in a number of word memories 11a, 11b, ..., 11n are retrieved using the retrieval data in its entirety or in a part specified, so that an address of the word memory involved in the data match is generated, and thus it is possible to read out the whole data stored in the word memory.

FIG. 7 is a detailed circuit diagram of one of the word memories in the associative memory.

A word memory 11 comprises, for example, five memory cells 11-1, 11-2, ..., and 11-5 each having the same structure. The memory cells 11-1, 11-2, ..., and 11-5 are provided with first inverters 20-1, 20-2, ..., and 20-5 and second inverters 21-1, 21-2, ..., and 21-5, in pairs such that their outputs are connected to their inputs, respectively. Providing pairs of inverters 20-1 and 21-1; 20-2 and 21-2; ...; and 20-5 and 21-5 permits the memory cells 11-1, 11-2, ..., and 11-5 to store one bit information expressed by logic "1" or logic "0", respectively.

In the memory cells 11-1, 11-2, ..., and 11-5, the outputs of the first inverters 20-1, 20-2, ..., and 20-5 are connected through N channel transistors 22-1, 22-2, ..., and 22-5 to bit lines 23-1, 23-2, ..., and 23-5, respectively. Gate electrodes of the transistors 22-1, 22-2, ..., and 22-5 are connected to a word line 24. The outputs of the second inverters 21-1, 21-2, ..., and 21-5 are connected through N channel transistors 25-1, 25-2, ..., and 25-5 to bit bar lines 26-1, 26-2, ..., and 26-5, respectively. Gate electrodes of the transistors 25-1, 25-2, ..., and 25-5 are also connected to the word line 24. Further, in the memory cells 11-1, 11-2, ..., and 11-5, there are provided pairs of N channel transistors 27-1 and 28-1; 27-2 and 28-2; ...; and 27-5 and 28-5, respectively, which are connected in series between the bit lines 23-1, 23-2, ..., and 23-5 and the bit bar lines 26-1, 26-2, ..., and 26-5, respectively. Gate electrodes of transistors 27-1, 27-2 ..., and 27-5, as ones of these pairs of transistors 27-1 and 28-1; 27-2 and 28-2; ...; and 27-5 and 28-5, are connected to the outputs of the second inverters 21-1, 21-2, ..., and 21-5, respectively; and gate electrodes of other transistors 28-1, 28-2, ..., and 28-5 are connected to the outputs of the first inverters 20-1, 20-2, ..., and 20-5, respectively.

Between a match line 14 and the ground GND, there are provided pairs of N channel transistors 29-1 and 35-1; 29-2 and 35-2; ...; and 29-5 and 35-5, respectively, which are each connected in series and correspond to the associated memory cell. Gate electrodes of the transistors 29-1, 29-2, ..., and 29-5 at the side of the match line 14 are connected to points between the pairs of transistors 27-1 and 28-1; 27-2 and 28-2; ...; and 27-5 and 28-5, respectively; and gate electrodes of the transistors 35-1, 35-2, ..., and 35-5 at the side of the ground GND are connected to a control line 30.

Connected to the match line 14, at the right hand in FIG. 7, is a sensing inverter 31 of which an output extends in the form of the match line 14 and is connected to the priority encoder 15 shown in FIG. 6.

Between an input of the inverter 31 and a power supply $V_{DD}$, a pair P channel transistors 32 and 33 are disposed. Gate of the transistor 32 is connected to the control line 30. Gate of the transistor 33 is connected to the output of the inverter 31.

In the associative memory having the word memories as mentioned above in structure and its peripheral circuits, a match retrieval is conducted in a manner as set forth below.

Assuming that the memory cell 11-1 stores information of a logic "1", the output side of the first inverter 20-1 takes a state of a logic "1", and the output side of the second inverter 21-1 takes a state of a logic "0".

It is assumed that a retrieval for a logic "1" is performed for the above-mentioned memory cell 11-1. That is, the bit line 23-1 is enabled with a logic "1", and the bit bar line 26-1 is enabled with a logic "0". While the word line 24 is kept in a state of a logic "0". Since the logic levels "0" and "1" are applied to the gate electrodes of the transistors 27-1 and 28-1, respectively, the transistor 27-1 turns off and the transistor 28-1 turns on. Thus, the logic "0", which appears on the bit bar line 26-1, will be applied through the transistor 28-1 to the gate electrode of the transistor 29-1, so that the transistor 29-1 turns off.

To conduct a retrieval, first, the control line 30 is enabled with "0", so that a transistor 32 turns on whereby a match line 14 at the input side of the inverter 31 is precharged. Thereafter, the control line 30 is enabled with "1", so that a transistor 32 turns off to stop the precharge and the transistors 35-1, 35-2, . . . , and 35-5 turn on.

In case of the memory cell 11-1, however, as mentioned above, the transistor 29-1 is kept turning off. Accordingly, when all of the memory cells 11-1, 11-2, . . . , and 11-5 are in a state of the "match", the match line 14 is kept on precharge, so that the output of the inverter 31 becomes a logic "0".

Assuming that the memory cell 11-2 stores information of a logic "0", the output side of the first inverter 20-2 takes a state of a logic "0", and the output side of the second inverter 21-2 takes a state of a logic "1".

It is assumed that a retrieval for a logic "1" is also performed for the above-mentioned memory cell 11-2. That is, the bit line 23-2 is enabled with a logic "1", and the bit bar line 26-2 is enabled with a logic "0". Since the logic levels "1" and "0" are applied to the gate electrodes of the transistors 27-2 and 28-2, respectively, the transistor 27-2 turns on and the transistor 28-2 turns off. Thus, the logic "1", which appears on the bit line 23-2, will be applied through the transistor 27-2 to the gate electrode of the transistor 29-2, so that the transistor 29-2 turns on. That is, when the match line 14 is precharged and then the control line 30 is enabled with the logic "1", both the transistors 29-2 and 35-2 turn on, so that the electric charge, which has been precharged on the match line 14, is discharged through the transistors 29-2 and 35-2. Consequently, the input side of the inverter 31 becomes the logic "0", and the inverter 31 outputs a logic level "1" of signal.

In this manner, according to the word memory 11 shown in FIG. 7, when a stored bit pattern coincides with that of the entered retrieval data, the match line 14 is not discharged and thus the output of the inverter 31 becomes the logic "0". On the other hand, when mismatched, the match line 14 is discharged and thus the output of the inverter 31 becomes the logic "1". Incidentally, according to the word memory 11 shown in FIG. 7, the inverter 31 outputs a logic level "0" of signal when matched, and in this respect it is different from the explanation concerning FIG. 6. However, this problem will be solved simply by means of inverting the signals.

Now, through masking a part of the retrieval data latched in the retrieval data register 12, it is possible to conduct a retrieval for a match or mismatch for only the remaining bit pattern which is not masked. In this case, with respect to the masked bit, as shown concerning the memory cell 11-5, both the bit line 23-5 and the bit bar line 26-5 are enabled with the logic "0". In this case, while either the transistor 27-5 or the transistor 28-5 turns on in accordance with the fact that the memory cell 11-5 has stored logic "0" of information or logic "1" of information, the transistor 29-5 is kept turning off in any way, since both the bit line 23-5 and the bit bar line 26-5 are enabled with the logic "0". In other words, regarding the memory cell 11-5, it is considered that the stored information coincides with the retrieval information.

The constitution shown in FIG. 7 is of general in the conventional associative memory. In case of such a constitution, first, a number of match lines, which are provided for the associated word memories, respectively, are precharged and thereafter the match lines, which are involved in the mismatch and will occupy the majority of a number of match lines, are discharged whereby a match or mismatch is retrieved. Therefore, this involves such a problem that the precharge and discharge on the match lines consume very large electricity.

Further, the constitution shown in FIG. 7 will suffer from the following drawback.

FIG. 8 is a circuit diagram of a piece of memory cell as one element of the word memory shown in FIG. 7.

Here, for example, the first inverter 20 is representative of the first inverter 20-1, 20-2, . . . , and 20-5 shown in FIG. 7, and in this manner reference symbols are each depicted in a simple fashion so as to omit the numeral portion indicating the distinction among the memory cells.

Assuming that the memory cell shown in FIG. 8 stores information of a logic "0", the output side of the first inverter 20 takes a state of a logic "0", and the output side of the second inverter 21 takes a state of a logic "1". Now let us consider a case of the mismatch such that a logic "1" and a logic "0" are applied to the bit line 23 and the bit bar line 26, respectively.

In this condition, the transistor 27 turns on, so that the logic "1" appearing on the bit line 23 is applied to the gate electrode of the transistor 29. In a case where the potential of the bit line 23 is 5 V which is the same as the power supply voltage, about 3.6 V is applied to the gate electrode of the transistor 29 owing to the bias effect of the semiconductor substrate on which the associative memory is fabricated. Whereas, the match line 14 is precharged when the transistor 32 shown in FIG. 7 turns on. When the match line 14 is precharged, the potential on point P will rise up to, for example, about 7 V, owing to the presence of capacitance $C_{p1}$; between the drain and gate electrodes of the transistor 29. In addition, the source electrode side (the point P side) of the transistor 27 becomes a higher potential than 5 V which is applied to the gate electrode thereof, and thus the transistor 27 turns off. While the transistor 28 is kept turning off since the logic "0" has been applied to the gate electrode thereof. Hence, a channel through which the electric charge on the point P passes will be broken, and thus the potential on the point P retains the above-mentioned about 7 V.

Recently, higher integration of an LSI advances, and also hereafter such a tendency will increasingly continue. However, if the point P becomes such a high potential that it exceeds the power supply voltage as mentioned above, this is in danger of destroying the transistors 27 and 28 when placed in a minuteness.

SUMMARY OF THE INVENTION

In view of the foregoing, it is therefore an object of the present invention to provide an associative memory capable of reducing electricity to be consumed in retrieval comparing with the prior art.

The first associative memory according to the present invention, which attains the above-mentioned object, basically comprises a word memory adapted to store a word of digital data, a match line associated with said word memory, said match line being arranged to undergo a precharge to a first predetermined potential and a discharge to a second predetermined potential, and a match detection circuit associated with said word memory, said match detection circuit being arranged to output a match signal to the associated match line when a match between the digital data stored in said word memory and an entered retrieval data is detected in a bit pattern of a whole or a specified part of those data. In the first associative memory, said match detection circuit comprises:

(1-1) a precharge circuit for precharging said associated match line at the time of a precharge prior to a retrieval; and (1-2) a discharge circuit for discharging said associated match line to the second predetermined potential when the match is detected at the time of a retrieval.

In the associative memory as mentioned above, it is preferred that (1-3) one end of said match line is fixed to the second predetermined potential, (1-4) said precharge circuit is connected to another end of said match line so that said match line is precharged from said another end which is on the opposite side of said one end of said match line, and (1-5) said match detection circuit has a switching circuit provided between the one end and the another end of said match line, said switching circuit being arranged, in the precharge, to electrically disconnect between the one end and the another end of said match line, and in the retrieval, to electrically connect between the one end and the another end of said match line.

Further, it is preferred that (1-6) said switching circuit has a terminal which is directly fixed to the second predetermined potential without passing through any switching elements.

According to the conventional associative memory, it is so arranged that prior to a retrieval, first, a number of match lines, which are associated with a number of word memories, respectively, are precharged, and when a bit pattern stored in the word memory is coincident with that for the retrieval, the associated match line is kept being precharged, on the other hand, in case of the mismatch, the corresponding match lines are discharged, whereby a match signal is outputted.

By the way, an associative memory is used for detecting, from among a number of word memories storing various bit patterns, part of the word memories which matches in a bit pattern. Consequently, usually, the great part of a number of match lines which have been precharged are of mismatch and thus are obliged to be discharged. As a result, when the subsequent retrieval concerning other bit pattern is performed, it is necessary, prior to the retrieval, to again precharge most of the match lines. This will be a cause of increasing electricity to be consumed.

Upon notice of the matter mentioned above, the present invention has been made. Specifically, according to the first associative memory of the present invention, it is so arranged that first, a number of match lines are precharged, and thereafter a bit match line, that is, a match line associated with the word memory which stores a bit pattern equivalent to that for use in retrieval, is discharged. Thus, only part of the match lines, which match in the bit pattern, are discharged, so that the great part of match lines are kept being precharged. Hence, a precharge prior to the subsequent retrieval are only part of the match lines which are subjected to the discharge. Thus, it is possible to implement an associative memory which consumes very little electricity caused by the retrieval.

In the above-mentioned first associative memory, providing the switching circuit makes it possible to reliably precharge the match line, since the switching circuit is in a disconnecting state when the precharge is conducted. Thus, it is possible to prevent a malfunction due to a variation in operational timing between the elements constituting the associative memory, and the like. This switching circuit may be disposed at such a location that a variation in potential, which will be caused by a redistribution of electric charge precharged on the match line when the match line is fully precharged so that the switching circuit becomes a conductive state, to non-precharged portions of the match line, has no effect on the match line. While there is no need to unequivocally determine a setting position of the switching circuit, if the switching circuit is disposed at the position as recited in the above-referenced item (1-6), the problem of the redistribution of electric charge may be completely avoided.

Specifically, the first associative memory of the present invention may adopts arrangements of the second to the fifth associative memories set forth below.

The second associative memory according to the present invention comprises a word memory adapted to store a word of bit pattern, said word memory having a word of memory cells each for storing one bit, and a match detection circuit associated with said word memory, said match detection circuit being arranged to detect whether or not said associated word memory stores a bit pattern which corresponds to a bit pattern of a whole or a specified part of an entered retrieval data. In the second associative memory, (2-1) said memory cells each comprise:

(2-1-1) first and second inverters each having an input and an output in which the input of said first inverter is connected with the output of said second inverter, and the input of said second inverter is connected with the output of said first inverter;

(2-1-2) a first first conductivity type transistor connected between a bit line and a first node to which the output of said first inverter and the input of said second inverter are connected, a gate of said first first conductivity type transistor being connected to a word line;

(2-1-3) a second first conductivity type transistor connected between a bit bar line and a second node to which the output of said second inverter and the input of said first inverter are connected, a gate of said second first conductivity type transistor being connected to the word line;

(2-1-4) a third first conductivity type transistor connected to the bit line at one end thereof, a gate of said third first conductivity type transistor being connected to the first node; and (2-1-5) a fourth first conductivity type transistor connected between another end of said third first conductivity type transistor and the bit bar line, a gate of said fourth first conductivity type transistor being connected to the second node, and (2-2) wherein said match detection circuit comprises:

(2-2-1) a sense amplifier for detecting charge and discharge at an input end;

(2-2-2) a preset circuit for presetting the input end of said sense amplifier to a predetermined first potential;

(2-2-3) a plurality of fifth first conductivity type transistors connected in series at the input end of said sense amplifier, a gate of each of said plurality of fifth first conductivity type transistors being connected with a third node to which said third first conductivity type transistor and said fourth first conductivity type transistor are connected in each of said memory cells constituting said word memory associated with said match detection circuit; and (2-2-4) a sixth first conductivity type transistor provided between the plurality of fifth first conductivity type transistors or at another end on the opposite side from the input end of said sense amplifier, a gate of said sixth first conductivity type transistor being arranged to receive a control signal for providing such a control that in the present by said preset circuit a disconnecting state is offered, and in the detection for performing said detection a connecting state is offered, thereby controlling a switching between connection and disconnection to a predetermined second potential different from said first potential.

The third associative memory according to the present invention comprises a word memory adapted to store a word of bit pattern, said word memory having a word of memory cells each for storing one bit, and a match detection circuit associated with said word memory, said match detection circuit being arranged to detect whether or not said associated word memory stores a bit pattern which corresponds to a bit pattern of a whole or a specified part of an entered retrieval data. In the third associative memory, (3-1) said memory cells each comprise:

(3-1-1) first and second inverters each having an input and an output in which the input of said first inverter is connected with the output of said second inverter, and the input of said second inverter is connected with the output of said first inverter;

(3-1-2) a first first conductivity type transistor connected between a bit line and a first node to which the output of said first inverter and the input of said second inverter are connected, a gate of said first first conductivity type transistor being connected to a word line;

(3-1-3) a second first conductivity type transistor connected between a bit bar line and a second node to which the output of said second inverter and the input of said first inverter are connected, a gate of said second first conductivity type transistor being connected to the word line;

(3-1-4) a first second conductivity type transistor connected to the bit line at one end thereof, a gate of said first second conductivity type transistor being connected to the second node; and (3-1-5) a second second conductivity type transistor connected between another end of said first second conductivity type transistor and the bit bar line, a gate of said second second conductivity type transistor being connected to the first node, and (3-2) wherein said match detection circuit comprises:

(3-2-1) a sense amplifier for detecting charge and discharge at an input end;

(3-2-2) a preset circuit for presetting the input end of said sense amplifier to a predetermined first potential;

(3-2-3) a plurality of third first conductivity type transistors connected in series at the input end of said sense amplifier, a gate of each of said plurality of third first conductivity type transistors being connected with a third node to which said first second conductivity type transistor and said second second conductivity type transistor are connected in each of said memory cells constituting said word memory associated with said match detection circuit;

(3-2-4) a fourth first conductivity type transistor and a third second conductivity type transistor, one end of one of these transistors being maintained at a predetermined second potential different from said first potential, one end of another of these transistors being connected with said third first conductivity type transistor which is connected on a point at the longest distance from said sense amplifier, these transistors being connected with each other, a gate of said fourth first conductivity type transistor being connected with a control line through which a control signal is transmitted to provide such a control that in the present by said present circuit a disconnecting state is offered, and in the detection for performing said detection a connecting state is offered, said third second conductivity type transistor being arranged to form a diode through a diode-connection.

The fourth associative memory according to the present invention comprises a word memory adapted to store a word of bit pattern, said word memory having a word of memory cells each for storing one bit, and a match detection circuit associated with said word memory, said match detection circuit being arranged to detect whether or not said associated word memory stores a bit pattern which corresponds to a bit pattern of a whole or a specified part of an entered retrieval data. In the fourth associative memory, (4-1) said memory cells each comprise:

(4-1-1) first and second inverters each having an input and an output in which the input of said first inverter is connected with the output of said second inverter, and the input of said second inverter is connected with the output of said first inverter;

(4-1-2) a first first conductivity type transistor connected between a bit line and a first node to which the output of said first inverter and the input of said second inverter are connected, a gate of said first first conductivity type transistor being connected to a word line;

(4-1-3) a second first conductivity type transistor connected between a bit bar line and a second node to which the output of said second inverter and the input of said first inverter are connected, a gate of said second first conductivity type transistor being connected to the word line;

(4-1-4) a third first conductivity type transistor connected to the bit line at one end thereof, a gate of said third first conductivity type transistor being connected to the first node;

(4-1-5) a fourth first conductivity type transistor connected between another end of said third first conductivity type transistor and the bit bar line, a gate of said fourth first conductivity type transistor being connected to the second node, (4-1-6) a first second conductivity type transistor connected to the bit line at one end thereof, a gate of said first second conductivity type transistor being connected to the second node; and (4-1-7) a second second conductivity type transistor connected between another end of said first second conductivity type transistor and the bit bar line, a gate of said second second conductivity type transistor being connected to the first node, and (4-2) wherein said match detection circuit comprises:

(4-2-1) a sense amplifier for detecting charge and discharge at an input end;

(4-2-2) a preset circuit for presetting the input end of said sense amplifier to a predetermined first potential;

(4-2-3) a plurality of fifth first conductivity type transistors connected in series at the input end of said sense amplifier, a gate of each of said plurality of fifth first conductivity type transistors being connected with both a third node to which said third first conductivity type transistor and said fourth first conductivity type transistor are connected and a fourth node to which said first second conductivity type transistor and said second second conductivity type transistor are connected in each of said memory cells constituting said word memory associated with said match detection circuit; and (4-2-4) a sixth first conductivity type transistor provided between the plurality of fifth first conductivity type transistors or at another end on the opposite side from the input end of said sense amplifier, a gate of said sixth first conductivity type transistor being arranged to receive a control signal for providing such a control that in the present by said preset circuit a disconnecting state is offered, and in the detection for performing said detection a connecting state is offered, thereby controlling a switching between connection and disconnection to a predetermined second potential different from said first potential.

The fifth associative memory according to the present invention comprises a plurality of word memories each adapted to store a word of bit pattern, said word memory having a word of memory cells each for storing one bit, and a plurality of match detection circuits associated with said plurality of word memories, respectively, said match detection circuit being arranged to detect whether or not said associated word memory stores a bit pattern which corresponds to a bit pattern of a whole or a specified part of an entered retrieval data. In the fifth associative memory, (5-1) said memory cells each comprise:

(5-1-1) first and second inverters each having an input and an output in which the input of said first inverter is connected with the output of said second inverter, and the input of said second inverter is connected with the output of said first inverter;

(5-1-2) a first first conductivity type transistor connected between a bit line and a first node to which the output of said first inverter and the input of said second inverter are connected, a gate of said first first conductivity type transistor being connected to a word line;

(5-1-3) a second first conductivity type transistor connected between a bit bar line and a second node to which the output of said second inverter and the input of said first inverter are connected, a gate of said second first conductivity type transistor being connected to the word line;

(5-1-4) a first second conductivity type transistor one end of which is maintained at a predetermined first potential, a gate of said first second conductivity type transistor being connected to the bit line;

(5-1-5) a second second conductivity type transistor one end of which is connected with another end of said first second conductivity type transistor, a gate of said second second conductivity type transistor being connected to the first node;

(5-1-6) a third second conductivity type transistor one end of which is connected with another end of said second second conductivity type transistor, a gate of said third second conductivity type transistor being connected to the second node;

(5-1-7) a fourth second conductivity type transistor one end of which is connected with another end of said third second conductivity type transistor, another end is maintained at the predetermined first potential, a gate of said fourth second conductivity type transistor being connected to the bit bar line;

(5-1-8) a third first conductivity type transistor one end of which is maintained at a predetermined second potential different from the predetermined first potential, a gate of said third first conductivity type transistor being connected to the bit line;

(5-1-9) a fourth first conductivity type transistor one end of which is connected with another end of said third first conductivity type transistor, a gate of said fourth first conductivity type transistor being connected to the second node;

(5-1-10) a fifth first conductivity type transistor one end of which is connected with another end of said fourth first conductivity type transistor, a gate of said fifth first conductivity type transistor being connected to the first node; and (5-1-11) a sixth first conductivity type transistor one end of which is connected with another end of said fifth first conductivity type transistor, another end is maintained at the predetermined second potential, a gate of said sixth first conductivity type transistor being connected to the bit bar line;

(5-2) wherein said match detection circuits each comprise:

(5-2-1) a sense amplifier for detecting charge and discharge at an input end;

(5-2-2) a preset circuit for presetting the input end of said sense amplifier to a predetermined first potential;

(5-2-3) a plurality of seventh first conductivity type transistors connected in series at the input end of said sense amplifier, a gate of each of said plurality of seventh first conductivity type transistors being connected with both a third node to which said second second conductivity type transistor and said third second conductivity type transistor are connected and a fourth node to which said fourth first conductivity type transistor and said fifth first conductivity type transistor are connected in each of said memory cells constituting said word memory associated with said match detection circuit; and (5-2-4) an eighth first conductivity type transistor provided between the plurality of seventh first conductivity type transistors or at another end on the opposite side from the input end of said sense amplifier, a gate of said eighth first conductivity type transistor being arranged to receive a control signal for providing such a control that in the present by said preset circuit a disconnecting state is offered, and in the detection for performing said detection a connecting state is offered, thereby controlling a switching between connection disconnection to a predetermined second potential different from said first potential.

In the second to fifth associative memories according to the present invention, the components "first conductivity type transistor" and "second conductivity type transistor" denote one and the other of an N-channel transistor and a P-channel transistor, respectively. And the terms "first potential" and "second potential" denote, when the N-channel transistor is selected as the first conductivity type transistor, a power supply potential and a ground potential, respectively, and when the P-channel transistor is selected as the first conductivity type transistor, the ground potential and the power supply potential, respectively.

Here, as a matter of convenience, there will be explained a case where the N-channel transistor is selected as the first conductivity type transistor, and the P-channel transistor is selected as the second conductivity type transistor.

One of the aspects of the second to fifth associative memories according to the present invention resides in the point that the third N-channel transistors (e.g. the fifth first conductivity type transistors recited in the above-referenced item (2-2-3), the third first conductivity type transistors recited in the above-referenced item (3-2-3), the fifth first conductivity type transistors recited in the above-referenced item (4-2-3), and the seventh first conductivity type transistors recited in the above-referenced item (5-2-3)), which are provided in the associated memory cell, are connected in series each other in the portion corresponding to the match line in the above-mentioned first associative memory. This feature allows a discharge only when data stored in the word memory and entered retrieval data match with each other over the whole bits (as aforementioned, the masked bit is regarded as a "match"). Thus, opportunities to be discharged are little comparing with the prior art whereby electricity to be consumed is reduced.

Another of the aspects of the second to fifth associative memories according to the present invention resides in the point that there is provided the switching circuit (e.g. the sixth first conductivity type transistor recited in the above-referenced item (2-2-4), the fourth first conductivity type transistor recited in the above-referenced item (3-2-4), the sixth first conductivity type transistor recited in the above-referenced item (4-2-4), and the eighth first conductivity type transistor recited in the above-referenced item (5-2-4)), which is constituted of an N-channel transistor, in the above-mentioned second associated memory. Providing the switching circuit (the N-channel transistor) makes it possible to reliably precharge the match line. Thus, it is possible to prevent a malfunction due to a variation in operational timing between the elements constituting the associative memory, and the like. Further, it is preferable that the switching circuit (the N-channel transistor) is provided at one end of the match line, according to the second to fifth associative memories, in order to prevent a malfunction due to a redistribution of electric charge on the match line.

Further, according to the third to fifth associative memories, there is solved the problem of unexpected potential variation, such as a boost of potential, as explained referring to FIG. 8.

One of the aspects of the third associative memory according to the present invention resides in the second conductivity type (P-channel) transistors recited in the above-referenced items (3-1-4) and (3-1-5). Providing these P-channel transistors keeps the connecting point of these transistor-to-transistor at most a power supply potential, preventing the potential of the connecting point from being a higher potential than the power supply potential. Consequently, it is possible to provide a high reliability of associative memory.

Further, the third associative memory according to the present invention is also characterized by the second conductivity type (P-channel) transistor recited in the above-referenced item (3-2-4). According to the third associative memory, in case of the mismatch, there is a fear such that gates of the first conductivity type (N-channel) transistors (the above-referenced item (3-2-3)), which are arranged on the match line, do not go down in potential to the ground potential and keep about 1.4 V. However, providing the second conductivity type (P-channel) transistor recited in the above-referenced item (3-2-4) prevents the N-channel transistors from turning on.

The fourth associative memory according to the present invention is provided with both the first conductivity type (N-channel) transistors recited in the above-referenced items (4-1-4) and (4-1-5) and the second conductivity type (P-channel) transistors recited in the above-referenced items (4-1-6) and (4-1-7). Thus, their connecting points (gates of the first conductivity type (N-channel) transistors recited in the above-referenced item (4-2-3)) are each boosted in potential, in a high potential side, up to the power supply potential through the P-channel transistor and clipped with the power supply potential, and each go down in potential, in a low potential side, up to the ground potential and clipped with the ground potential. Accordingly, it is possible to prevent occurrence of such a high potential exceeding the power supply potential, and such a low potential exceeding the ground potential. Further, according to the fourth associative memory, different from the third associative memory, a voltage may swing fully between the power supply potential and the ground potential. Thus, there is no need to provide the second conductivity type (P-channel) transistor recited in the above-referenced item (3-2-4) as in the third associative memory, and it is possible to attain a high margin in design, and in addition possible to implement an associative memory which is strong in the irregularity of elements and a variation in the power supply voltage.

The fifth associative memory according to the present invention is provided with both the second conductivity type (P-channel) transistors recited in the above-referenced items (5-1-4) to (5-1-7) and the first conductivity type (N-channel) transistors recited in the above-referenced items (5-1-8) to (5-1-11). Thus, similar to the fourth associative memory as mentioned above, gates of the first conductivity type (N-channel) transistors recited in the above-referenced item (5-2-3)) are each clipped with the power supply potential and the ground potential. Accordingly, it is possible to prevent occurrence of such a high potential exceeding the power supply potential and such a low potential exceeding the ground potential. Further, according to the fifth associative memory as mentioned above, a voltage may swing fully between the power supply potential and the ground potential. Thus, similar to the fourth associative memory as mentioned above, it is possible to attain a high margin in design.

Furthermore, according to the fifth associative memory, the bit line and the bit bar line are connected with gates of the second conductivity type (P-channel) transistors recited in the above-referenced items (5-1-4) and (5-1-7), respectively, and also with gates of the first conductivity type (N-channel) transistors recited in the above-referenced items (5-1-8) and (5-1-11). Thus, according to the fifth associative memory, a load of drive circuits for driving the bit line and bit bar line is reduced in comparison with the fourth associative memory, but increasing the number of transistors constituting the respective memory cells.

DESCRIPTION OF THE PREFERRED EMBODIMENTS

Hereinafter, there will be described embodiments of the present invention.

Figure 1:
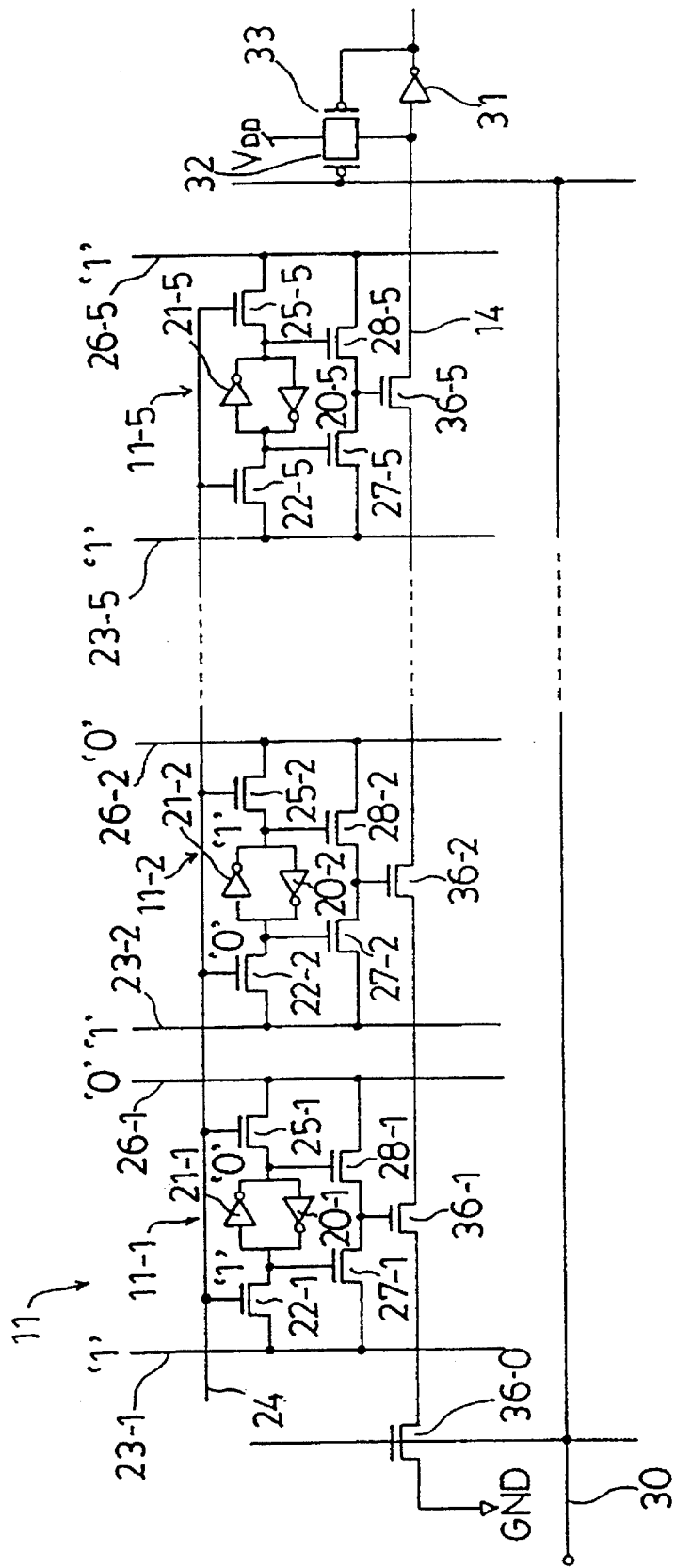
FIG. 1 is a circuit diagram of one of word memories in the second associative memory according to an embodiment of the present invention.

FIG. 1 is a circuit diagram of one of word memories in the second associative memory according to an embodiment of the present invention. In FIG. 1, the same parts are denoted by the same reference numbers as those of FIG. 7, and the redundant description will be omitted.

Gate electrodes of the transistors 27-1, 27-2, . . . , and 27-5, which transistors are included in the word memories 11-1, 11-2, . . . , and 11-5, respectively, are connected with outputs of the first inverters 20-1, 20-2, . . . , and 20-5, respectively. In the similar fashion, gate electrodes of the transistors 28-1, 28-2, . . . , and 28-5, which transistors are included in the word memories 11-1, 11-2, . . . , and 11-5, respectively, are connected with outputs of the second inverters 21-1, 21-2, . . . , and 21-5, respectively.

On the match line 14, there are provided transistors 36-1, 36-2, . . . , and 36-5, which are associated with the word memories 11-1, 11-2, . . . , and 11-5, respectively, and are connected in series with each other. Gate electrodes of the transistors 36-1, 36-2, . . . , and 36-5 are connected to points between pairs of transistors 27-1 and 28-1; 27-2 and 28-2; . . . ; and 27-5 and 28-5, respectively.

Figure 6:
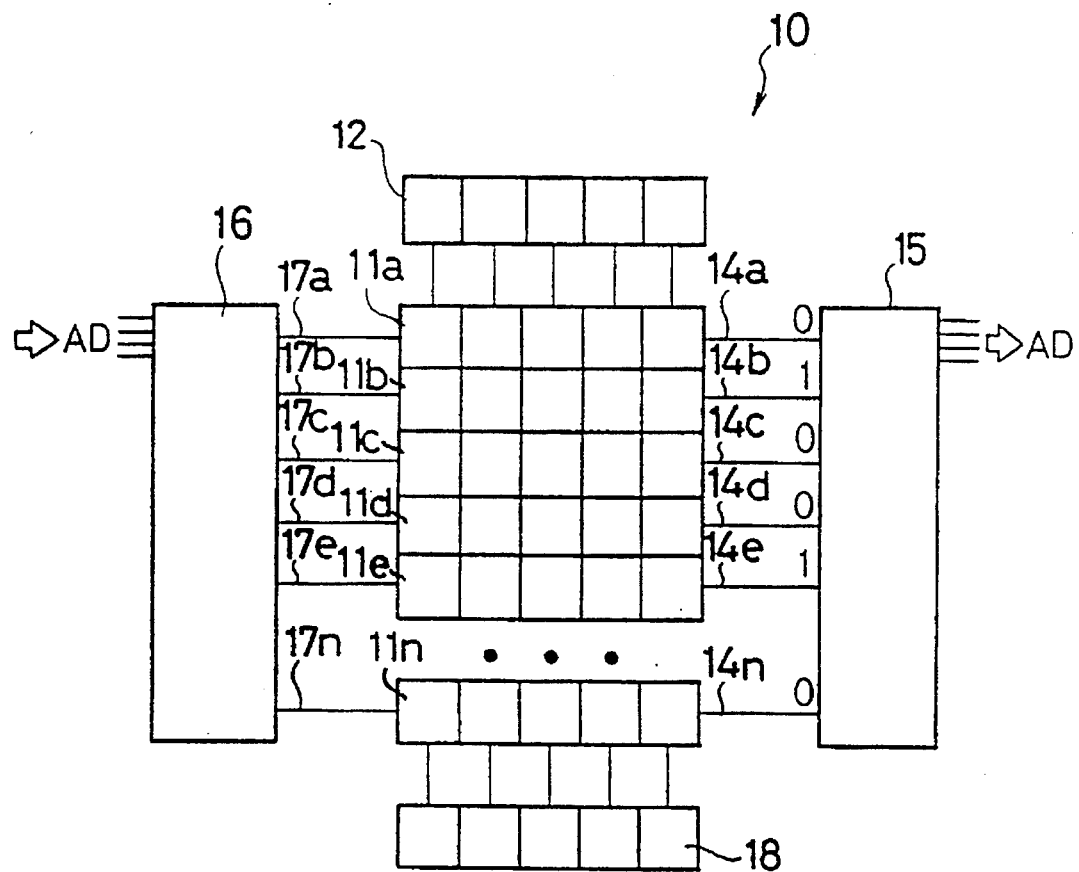
FIG. 6 is a circuit diagram of an associative memory according to the prior art by way of example.

Further, there is provided an additional transistor 36-0 connected in series with the match line 14 which is grounded through the transistor 36-0. A gate electrode of the transistor 36-0 is connected to the control line 30. Furthermore, there is provided an inverter 31 which is connected with the other end (right hand in FIG. 1) of the match line 14. The match line 14 extends also to the output side of the inverter 31 and is connected therethrough to the priority encoder 15 (refer to FIG. 6). Between an input of the inverter 31 and the power supply $V_{DD}$, there are provided two P-type transistor s 32 and 33. A gate electrode of the P-type transistor 32 is connected to the control line 30. A gate electrode of the P-type transistor 33 is connected to an output of the inverter 31.

In the associative memory having the word memories as mentioned above in structure and its peripheral circuits, a match retrieval is conducted in a manner as set forth below.

Figure 7:
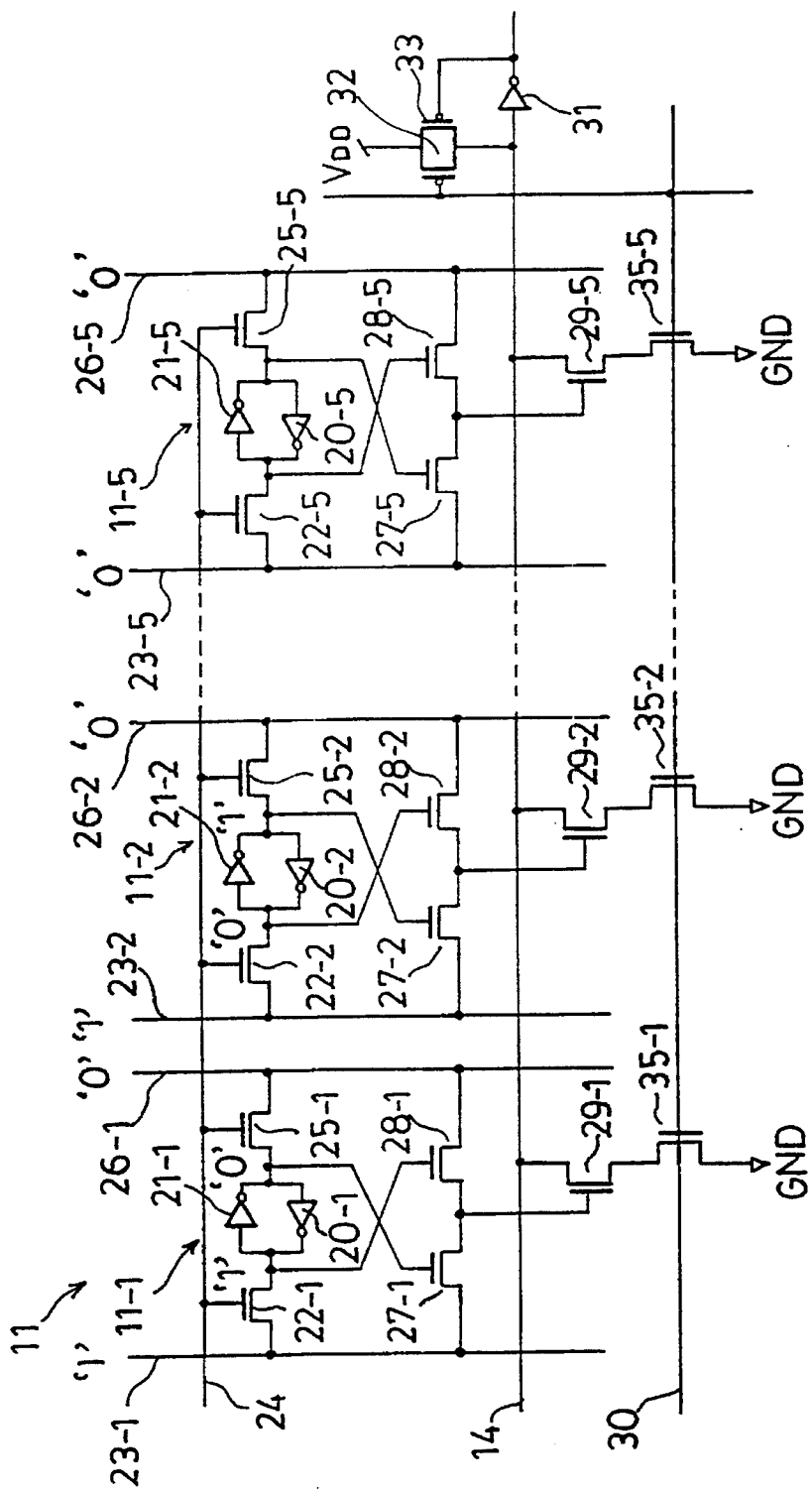
FIG. 7 is a circuit diagram of one of word memories in the conventional associative memory.

Assuming that the memory cell 11-1 stores information of a logic "1", similar to the case of the explanation concerning FIG. 7, the output side of the first inverter 20-1 takes a state of a logic "1", and the output side of the second inverter 21-1 takes a state of a logic "0".

It is assumed that a retrieval for a logic "1" is performed for the above-mentioned memory cell 11-1. That is, the bit line 23-1 is enabled with a logic "1", and the bit bar line 26-1 is enabled with a logic "0". While the word line 24 is kept in a state of a logic "0". Since a logic level "1" of voltage is applied to the gate electrode of the transistor 27-1, and a logic level "1" of signal on the bit line 23-1 is applied to the gate electrode of the transistor 36-1, the transistor 36-1 turns on. That is, when the bit information stored in the memory cell 11-1 and the bit information in the retrieval data entered through the bit line 23-1 and the bit bar line 26-1 are equivalent to each other, the associated transistor 36-1 turns on.

Assuming that the memory cell 11-2 stores information of a logic "0", the output side of the first inverter 20-2 takes a state of a logic "0", and the output side of the second inverter 21-2 takes a state of a logic "1".

It is assumed that a retrieval for a logic "1" is also performed for the above-mentioned memory cell 11-2. That is, the bit line 23-2 is enabled with a logic "1", and the bit bar line 26-2 is enabled with a logic "0". In this case, a logic level "0" of signal on the bit bar line 26-2 is applied through the transistor 28-2 to the gate electrode of the transistor 36-2, so that the transistor 36-2 is kept turning off. Thus, in case of the mismatch, the electric charge, which has been precharged on the match line 14, is not discharged.

With respect to the masked bit, as shown concerning the memory cell 11-5, both the bit line 23-5 and the bit bar line 26-5 are enabled with the logic "1". In this case, either the transistor 27-5 or the transistor 28-5 turns on in accordance with the fact that the memory cell 11-5 has stored logic "0" of information or logic "1" of information, so that the transistor 36-5 turns on in any way.

To conduct a retrieval, first, the control line 30 is enabled with "0", so that a transistor 32 turns on whereby a match line 14 at the input side of the inverter 31 is precharged. Thereafter, the control line 30 is enabled with "1", so that the transistor 32 turns off to stop the precharge and the transistor 36-0 turns on.

In this case, when data stored in the memory cells 11-1, 11-2, . . . , and 11-5, which memory cells constitute the word memory 11, match with the entered retrieval information throughout the memory cells (as mentioned above, the masked bit is regarded as a "match"), all of the transistors 36-1, 36-2, . . . , and 36-5 turn on, so that the electric charge, which has been precharged on the match line 14, is discharged. Thus, the inverter 31 outputs a logic "1" of signal.

As described above, according to the constitution as shown in FIG. 1, prior to the retrieval, the match line 14 is precharged, and only when the match is detected through the retrieval, electric charge which has been precharged on the match line 14 is discharged through the transistors 36-1, 36-2, . . . , and 36-5. Consequently, in the major occasion, only very few number of match lines are subjected to the discharge for each retrieval corresponding to the word memories in which the match were detected, and the majority of the match lines are kept being precharged. Thus, it is possible to reduce the number of match lines which need to be precharged in the subsequent retrieval thereby reducing electricity to be consumed in the retrieval.

Figure 8:
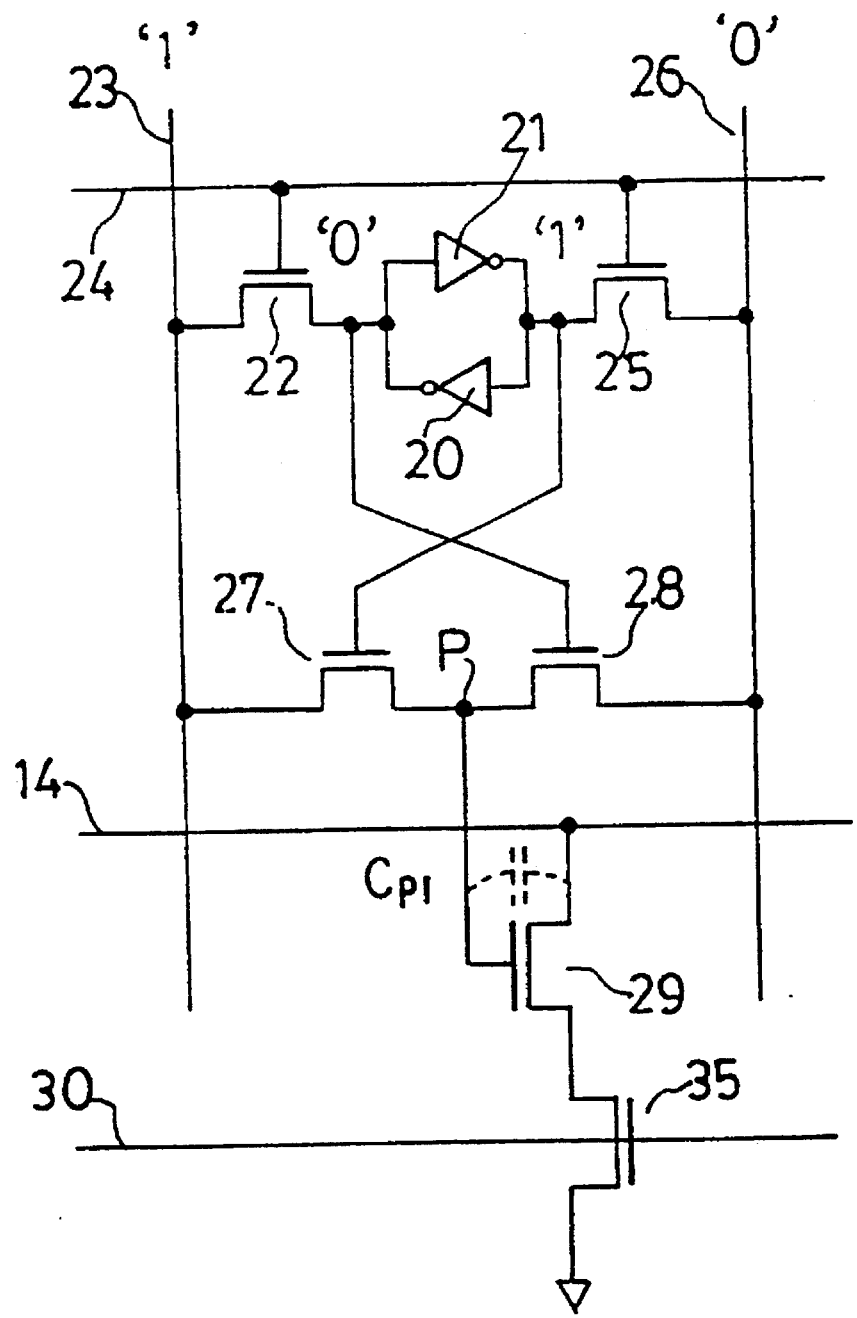
FIG. 8 is a circuit diagram of one of memory cells constituting the word memory shown in FIG. 7.

The associative memory as shown in FIG. 1 and described above is associated with, however, the problem which is the similar to the problem involved in the conventional associative memory described in conjunction with FIG. 8. There is a fear that such a problem comes to light when the devices are placed in a minuteness.

Figure 2:
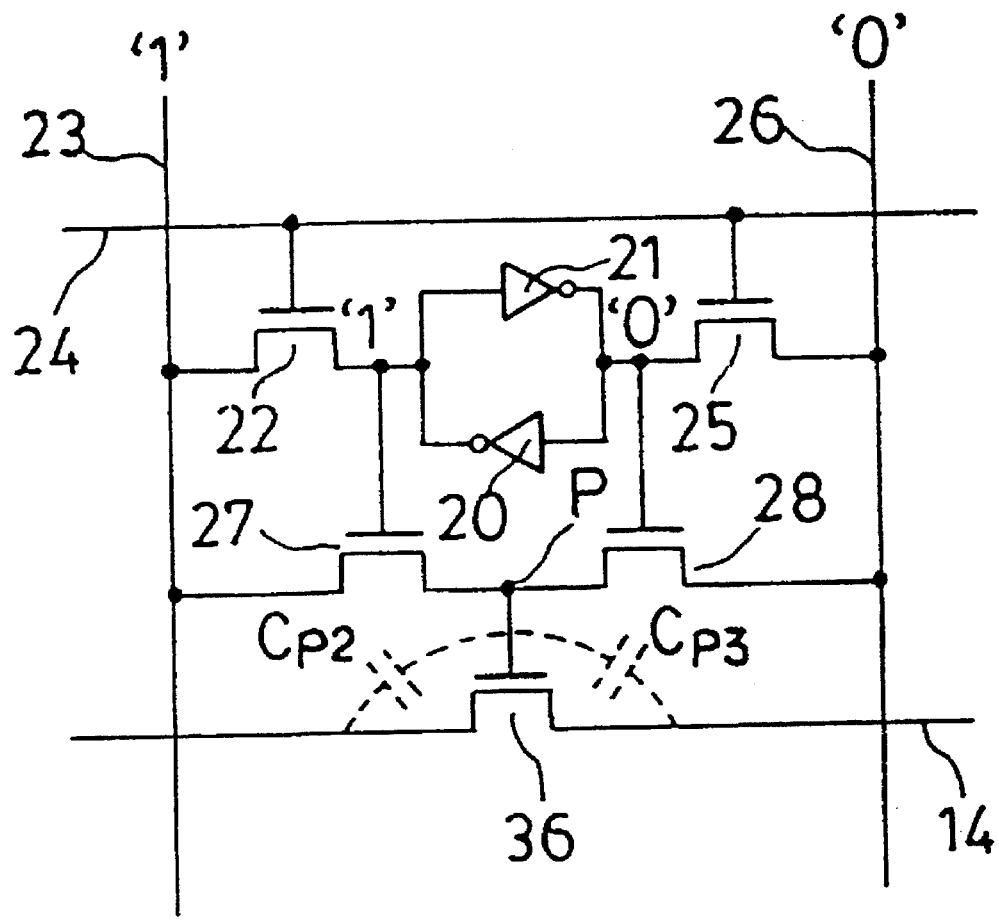
FIG. 2 is a circuit diagram of one of memory cells constituting the word memory shown in FIG. 1.

FIG. 2 is a circuit diagram of a piece of memory cell as one of the elements constituting the word memory shown in FIG. 1.

Assuming that the memory cell shown in FIG. 2 stores information of a logic "1" (the output side of the first inverter 20 takes a state of a logic "1"). Now let us consider a case of the match such that a logic "1" and a logic "0" are applied to the bit line 23 and the bit bar line 26, respectively.

In this condition, the transistor 27 turns on, so that the potential on point P becomes about 3.6 V. When the match line 14 is precharged, a drain and a source of the transistor 36 will rise up to about 3.6 V, respectively. Hence, the potential on the point P will rise up to about 7 V owing to the presence of capacitances $C_{P2}$ and $C_{P3}$ as illustrated.

Figure 3:
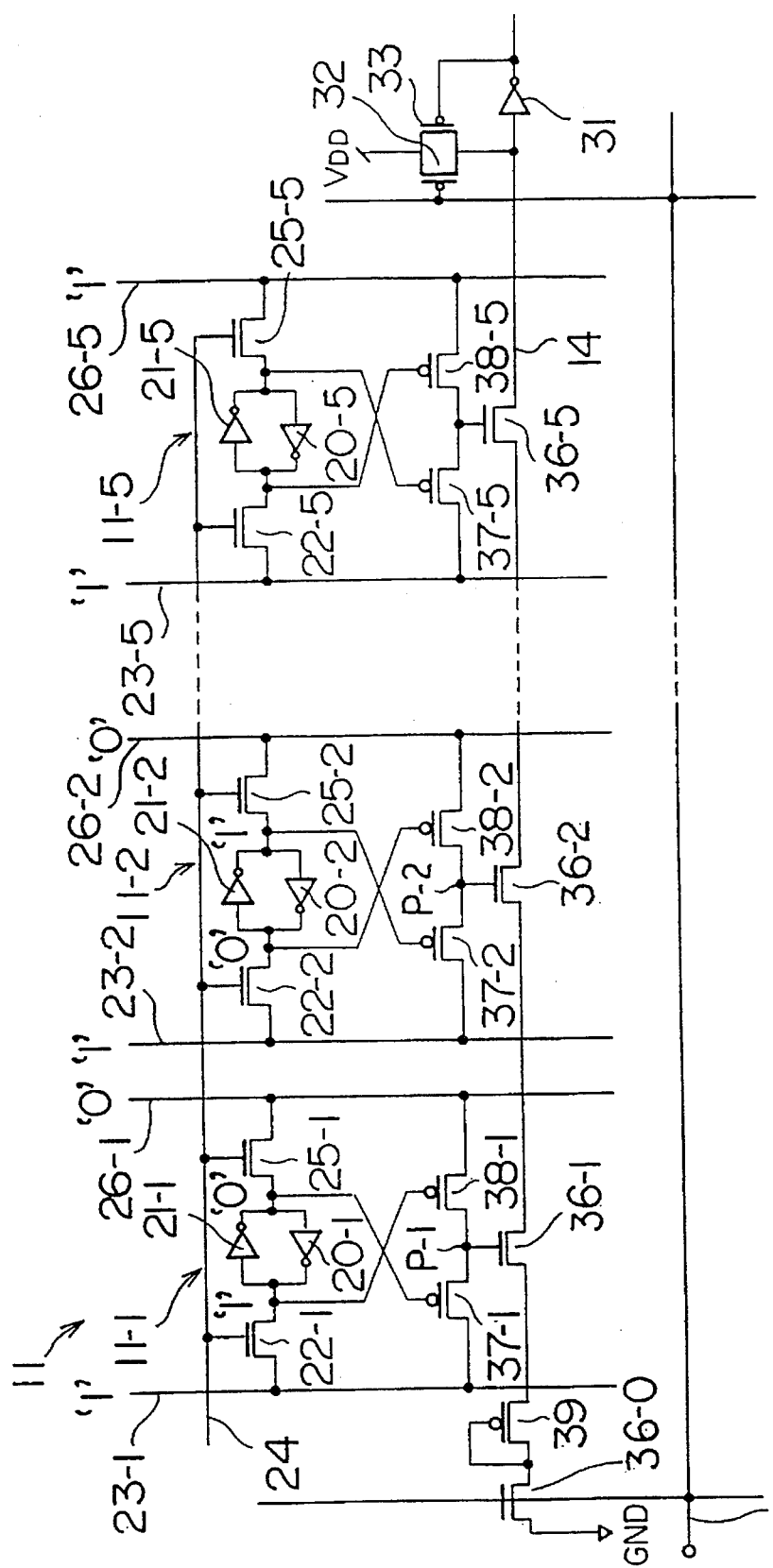
FIG. 3 is a circuit diagram of one of word memories in the third associative memory according to another embodiment of the present invention.

FIG. 3 is a circuit diagram of one of word memories in the third associative memory according to an embodiment of the present invention. In FIG. 3, the same parts are denoted by the same reference numbers as those of FIGS. 1 and 7, and the redundant description will be omitted.

In the word memory shown in FIG. 3, there are provided pairs of P-channel transistors 37-1 and 38-1; 37-2 and 38-2; . . . ; and 37-5 and 38-5, instead of pairs of N-channel transistors 27-1 and 28-1; 27-2 and 28-2; . . . ; and 27-5 and 28-5 on the associated memory cells in the word memory shown in FIG. 1, respectively. Gate electrodes of the transistors 37-1, 37-2, . . . , and 37-5, that is, ones of the pairs of P-channel transistors 37-1 and 38-1; 37-2 and 38-2; . . . ; and 37-5 and 38-5, are connected with outputs of the second inverters 21-1, 21-2, . . . , and 21-5, respectively. On the other hand, gate electrodes of the transistors 38-1, 38-2, . . . , and 38-5 are connected with outputs of the first inverters 20-1, 20-2, . . . , and 20-5, respectively.

Among the transistors 36-0, 36-1, 36-2, . . . , and 36-5, which are connected in series with each other between the match line 14 and the ground (GND), there is disposed a P-channel transistor 39 between the transistor 36-0 and 36-1. A gate electrode of the transistor 39 is connected to the side of the transistor 36-0 to form a diode.

In the associative memory having the word memories as mentioned above in structure and its peripheral circuits, a match retrieval is conducted in a manner as set forth below.

Assuming that the memory cell 11-1 stores information of a logic "1", similar to the case of the explanation concerning FIGS. 7 and 1, the output side of the first inverter 20-1 takes a state of a logic "1", and the output side of the second inverter 21-1 takes a state of a logic "0".

It is assumed that a retrieval for a logic "1" is performed for the above-mentioned memory cell 11-1. That is, the bit line 23-1 is enabled with a logic "1", and the bit bar line 26-1 is enabled with a logic "0". While the word line 24 is kept in a state of a logic "0". Since a logic level "0" of voltage is applied to the gate electrode of the transistor 37-1, and a logic level "1" of signal on the bit line 23-1 is applied to the gate electrode of the transistor 36-1, the transistor 36-1 turns on. That is, when the bit information stored in the memory cell 11-1 and the bit information in the retrieval data entered through the bit line 23-1 and the bit bar line 26-1 are equivalent to each other, the associated transistor 36-1 turns on.

Assuming that the memory cell 11-2 stores information of a logic "0", the output side of the first inverter 20-2 takes a state of a logic "0", and the output side of the second inverter 21-2 takes a state of a logic "1".

It is assumed that a retrieval for a logic "1" is also performed for the above-mentioned memory cell 11-2. That is, the bit line 23-2 is enabled with a logic "1", and the bit bar line 26-2 is enabled with a logic "0". In this case, a logic level "0" of signal on the bit bar line 26-2 is applied through the transistor 38-2 to the gate electrode of the transistor 36-2, so that the transistor 36-2 is kept turning off. Thus, in case of the mismatch, the electric charge, which has been precharged on the match line 14, is not discharged.

With respect to the masked bit, as shown concerning the memory cell 11-5, both the bit line 23-5 and the bit bar line 26-5 are enabled with the logic "1". In this case, either the transistor 37-5 or the transistor 38-5 turns on in accordance with the fact that the memory cell 11-5 has stored logic "0" of information or logic "1" of information, so that the transistor 36-5 turns on in any way.

To conduct a retrieval, first, the control line 30 is enabled with "0", so that a transistor 32 turns on whereby a match line 14 at the input side of the inverter 31 is precharged. Thereafter, the control line 30 is enabled with "1", so that the transistor 32 turns off to stop the precharge and the transistor 36-0 turns on.

In this case, when data stored in the memory cells 11-1, 11-2, . . . , and 11-5, which memory cells constitute the word memory 11, match with the entered retrieval information throughout the memory cells (as mentioned above, the masked bit is regarded as a "match"), all of the transistors 36-1, 36-2, . . . , and 36-5 turn on, so that the electric charge, which has been precharged on the match line 14, is discharged. Thus, the inverter 31 outputs a logic "1" of signal.

As described above, according to the constitution as shown in FIG. 3, similar to the case of the constitution as shown in FIG. 1, prior to the retrieval, the match line 14 is precharged, and only when the match is detected through the retrieval, electric charge which has been precharged on the match line 14 is discharged. Thus, it is possible to reduce the number of match lines which needs to be precharged in the subsequent retrieval thereby reducing electricity to be consumed in the retrieval.

Next, let us consider a boost of the potential in the circuit shown in FIG. 3.

As shown in the memory cell 11-1, in a case where a logic "1" of information is stored in the memory cell 11-1 and retrieval data is also given by a logic "1" to form a match, the transistor 37-1 turns on, so that a logic "1" of electric charge on the bit line 23-1 flows in toward the P-1 point. Thus, the logic "1" appears also on the P-1 point. Since the transistor 37-1 is a P-channel type, the potential of the P-1 point becomes 5 V which is the same as the potential on the bit line 23-1. In this state, if the match line 14 is precharged, the potential of the P-1 point is going to boost from 5 V to the higher potential. However, since the transistor 37-1 is a P-channel type, the redundant electric charge will flow through the transistor 37-1 to the bit line 23-1. As a result, the potential of the P-1 point is kept on the power supply voltage 5 V, without boosting higher than the power supply voltage 5 V. In this manner, it is possible to prevent the potential of the P-1 point from boosting to the potential higher than the power supply voltage, thereby enhancing the reliability.

While the about 3.6 V is applied to the gate electrode of the transistor 36-1, in case of the constitution shown in FIG. 1, according to the present embodiment, 5 V is applied to the gate electrode of the transistor 36-1. Thus, in case of the constitution according to the present embodiment, it is possible to enhance an operating speed in the match retrieval as well as the reliability.

Next, as shown in the memory cell 11-2, in a case where a logic "0" of information is stored in the memory cell 11-2 and retrieval data is given by a logic "1" to form a mismatch, the transistor 38-2 turns on, so that a logic "0" on the bit bar line 26-2 is transmitted to a P-2 point. In this state, if the match line 14 is precharged, the potential of the P-2 point boosts. However, since the transistor 38-2 is a P-channel type, the transistor 38-2 does not turn on until the potential of the P-2 point boosts up to about 1.4 V. Consequently, there is a possibility that the potential of the P-2 point boosts up to about 1.4 V. If none of measures is taken, the transistor 36-2 may turn on weakly. However, since the P-channel transistor 39 arranged to form a diode through a diode-connection is disposed on the match line 14, the source electrode side (transistor 36-1 side) of the transistor 36-2 is kept about 1.4 V. Accordingly, even if the potential of the P-2 point boosts up to about 1.4 V, the transistor 36-2 maintains the turn-off state.

As described above, according to the embodiment shown in FIG. 3, there is provided an associative memory with a high reliability capable of preventing a boost in potential exceeding a power supply potential, and also contributing to the enhancement of an operating speed and the reduction of an electric power to be consumed as well.

Figure 4:
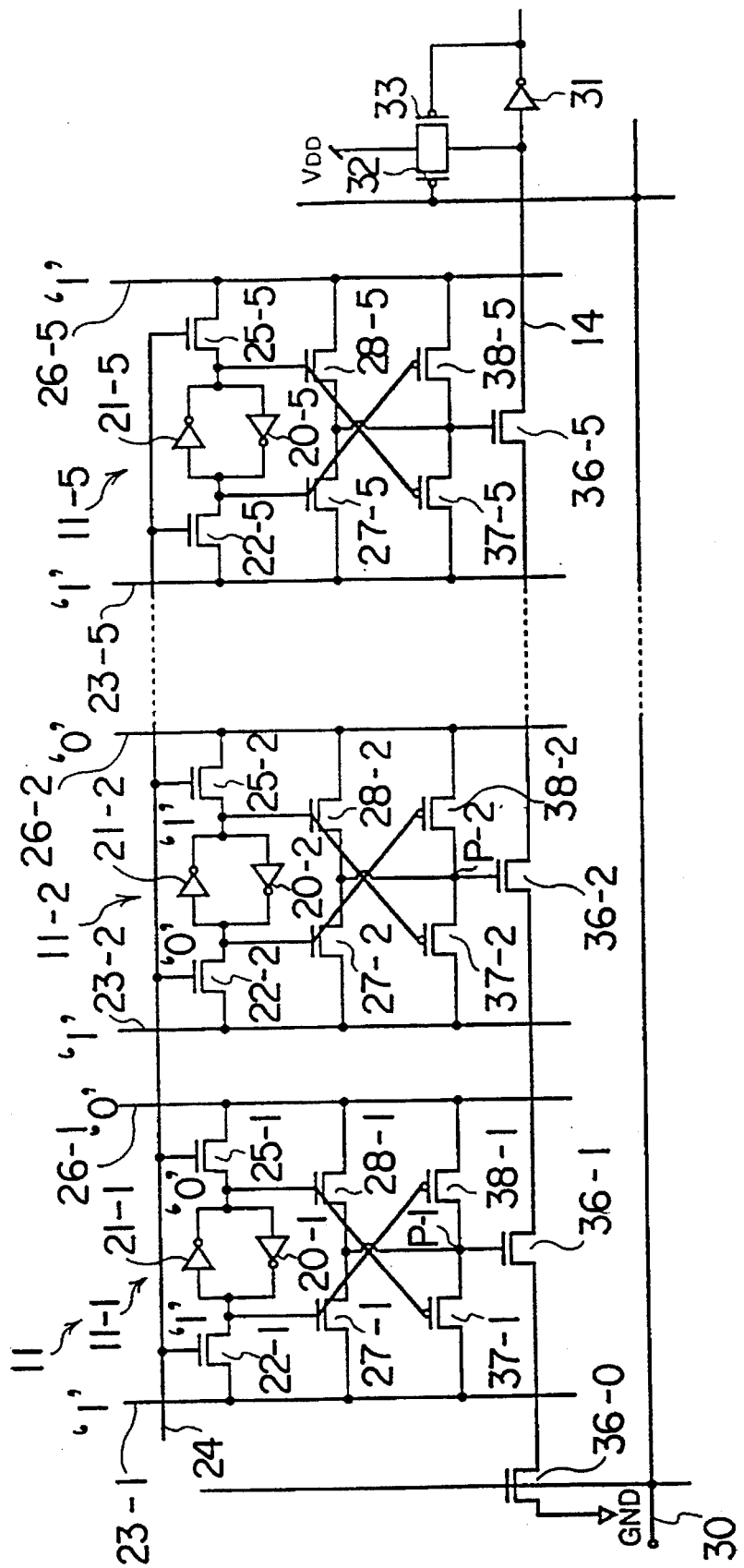
FIG. 4 is a circuit diagram of one of word memories in the fourth associative memory according to still another embodiment of the present invention.

FIG. 4 is a circuit diagram of one of word memories in the fourth associative memory according to an embodiment of the present invention. In FIG. 4, the same parts are denoted by the same reference numbers as those of FIGS. 1 and 3, and the redundant description will be omitted.

In the word memory shown in FIG. 4, there are provided pairs of P-channel transistors 37-1 and 38-1; 37-2 and 38-2; . . . ; and 37-5 and 38-5 on the associated memory cells in the word memory shown in FIG. 3, and in addition pairs of N-channel transistors 27-1 and 28-1; 27-2 and 28-2; . . . ; and 27-5 and 28-5 on the associated memory cells in the word memory shown in FIG. 1, respectively. Gate electrodes of the N-channel transistors 36-1, 36-2, . . . , and 36-5 arranged on the match line 14 are connected with the associated connecting points of the pairs of P-channel transistors 37-1 and 38-1; 37-2 and 38-2; . . . ; and 37-5 and 38-5, respectively, and in addition connected with the associated connecting points of the pairs of N-channel transistors 27-1 and 28-1; 27-2 and 28-2; . . . ; and 27-5 and 28-5, respectively.

Assuming that the memory cell 11-1 stores information of a logic "1", similar to the case of the explanation concerning FIGS. 1 and 3, the output side of the first inverter 20-1 takes a state of a logic "1", and the output side of the second inverter 21-1 takes a state of a logic "0".

It is assumed that a retrieval for a logic "1" is performed for the above-mentioned memory cell 11-1. That is, the bit line 23-1 is enabled with a logic "1", and the bit bar line 26-1 is enabled with a logic "0". While the word line 24 is kept in a state of a logic "0". Since a logic level "1" of voltage is applied to the gate electrode of the N-channel transistor 27-1, and a logic level "0" of voltage is applied to the gate electrode of the P-channel transistor 37-1, these transistors turn on. Thus, similar to the case of the memory cell 11-1 shown in FIG. 1, the N-channel transistor 36-1 turns on. That is, when the bit information stored in the memory cell 11-1 and the bit information in the retrieval data entered through the bit line 23-1 and the bit bar line 26-1 are equivalent to each other, the associated transistor 36-1 turns on.

Assuming that the memory cell 11-2 stores information of a logic "0", the output side of the first inverter 20-2 takes a state of a logic "0", and the output side of the second inverter 21-2 takes a state of a logic "1".

It is assumed that a retrieval for a logic "1" is also performed for the above-mentioned memory cell 11-2. That is, the bit line 23-2 is enabled with a logic "1", and the bit bar line 26-2 is enabled with a logic "0". In this case, a logic level "0" of signal on the bit bar line 26-2 is applied through both the N-channel transistor 28-2 and the P-channel transistor 38-2 to the gate electrode of the N-channel transistor 36-2, so that the N-channel transistor 36-2 is kept turning off. Thus, in case of the mismatch, the electric charge, which has been precharged on the match line 14, is not discharged.

With respect to the masked bit, as shown concerning the memory cell 11-5, both the bit line 23-5 and the bit bar line 26-5 are enabled with the logic "1". In this case, either both the N-channel transistor 27-5 and the P-channel transistor 37-5 or both the N-channel transistor 28-5 and the P-channel transistor 38-5 turn on in accordance with the fact that the memory cell 11-5 has stored logic "0" of information or logic "1" of information, so that the transistor 36-5 turns on in any way.

As described above, the word memory shown in FIG. 4 is in theory the same as that in FIG. 3. Thus, a retrieval is conducted in accordance with the sequence which is the same as the case of the embodiment shown in FIG. 3.

Next, let us consider a boost of the potential in the circuit shown in FIG. 4.

As shown in the memory cell 11-1, in a case where a logic "1" of information is stored in the memory cell 11-1 and retrieval data is also given by a logic "1" to form a match, the N-channel transistor 27-1 and the P-channel transistor 37-1 turn on, so that a logic "1" of electric charge on the bit line 23-1 flows in toward the P-1 point. Thus, the logic "1" appears also on the P-1 point. Since the transistor 37-1 is of a P-channel type, the potential of the P-1 point becomes 5 V which is the same as the potential on the bit line 23-1. In this state, if the match line 14 is precharged, the potential of the P-1 point is going to boost from 5 V to the higher potential. However, since the transistor 37-1 is a P-channel type, the redundant electric charge will flow through the transistor 37-1 to the bit line 23-1. As a result, the potential of the P-1 point is kept on the power supply voltage 5 V, without boosting higher than the power supply voltage 5 V. In this manner, also in case of the embodiment shown in FIG. 4, similar to the case of the embodiment shown in FIG. 3, it is possible to prevent the potential of the P-1 point from boosting to the potential higher than the power supply voltage, thereby enhancing the reliability. Further, in case of the embodiment shown in FIG. 4, it is also the same as the case of the embodiment shown in FIG. 3 in the point that an operating speed in the match retrieval is enhanced through applying 5 V to the gate electrode of the transistor 36-1.

Next, as shown in the memory cell 11-2, in a case where a logic "0" of information is stored in the memory cell 11-2 and retrieval data is given by a logic "1", the N-channel transistor 28-2 and the P-channel transistor 38-2 turn on. Thus, the P-2 point is shorted with respect to the bit bar line 26-2 on which a logic "0" appears, so that the logic "0" appears on the P-2 point. Since the transistor 28-2, which is one of two transistors 28-2 and 38-2 each serving as a short circuit between the bit bar line 26-2 and the P-2 point, is an N-channel type, the potential of the P-2 point goes down to 0 V which is the same as the potential of the bit bar line 26-2. In this manner, according to the embodiment shown in FIG. 4, the potential of the gate electrodes of the transistors 36-1, 36-2, . . . , and 36-5 arranged on the match line 14 swings fully between the power supply potential (5 V) and the ground potential (0 V). Thus, there is no need to provide the transistor 39 arranged to form a diode through a diode-connection, which transistor is provided in the the embodiment shown in FIG. 3. Further, according to the embodiment shown in FIG. 4, swinging fully between the power supply potential and the ground potential makes it possible to enhance a margin in the design, and in addition to implement an associative memory which is strong to the characteristic deviation of parts, the variation of the power supply voltage and the like.

Figure 5:
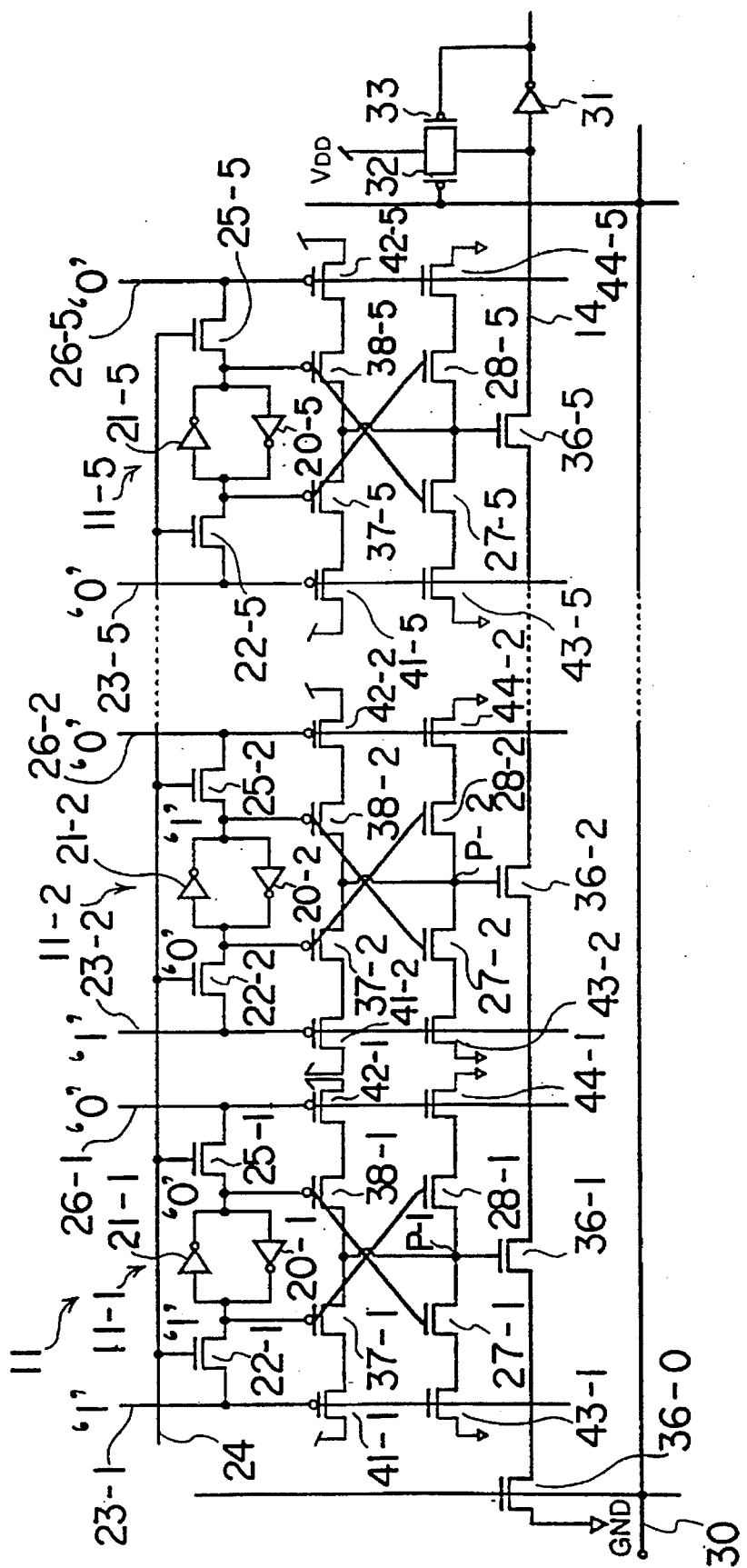
FIG. 5 is a circuit diagram of one of word memories in the fifth associative memory according to still another embodiment of the present invention.

FIG. 5 is a circuit diagram of one of word memories in the fifth associative memory according to an embodiment of the present invention.

In the word memory 11 shown in FIG. 5, there are provided pairs of P-channel transistors 37-1 and 38-1; 37-2 and 38-2; . . . ; and 37-5 and 38-5 on the associated memory cells in the word memory shown in FIG. 4, and in addition pairs of N-channel transistors 27-1 and 28-1; 27-2 and 28-2; . . . ; and 27-5 and 28-5 on the associated memory cells in the word memory shown in FIG. 4, respectively. The connecting relation of the gate electrodes of these pairs of transistors with the first inverters 20-1, 20-2, . . . , and 20-5 and the second inverter 21-1, 21-2, . . . , and 21-5 is the reverse of that in the respective memory cells shown in FIG. 4. That is, the gate of the P-channel transistor 37-1 and the gate of the N-channel transistor 28-1 are connected to the output end of the first inverter 20-1, and the gate of the P-channel transistor 38-1 and the gate of the N-channel transistor 27-1 are connected to the output end of the second inverter 21-1.

The memory cells 11-1, 11-2, . . . , and 11-5, which constitute the word memory 11 shown in FIG. 5, are provided with P-channel transistors 41-1, 41-2, . . . , and 41-5, respectively, each connected to a power supply at one end thereof, gate electrodes of which are connected to the bit lines 23-1, 23-2, . . . , and 23-5, respectively. While one ends of the P-channel transistors 37-1, 37-2, . . . , and 37-5 are connected, in the memory cells shown in FIG. 4, to the bit lines 23-1, 23-2, . . . , and 23-5, respectively, the equivalents are connected, in the memory cells shown in FIG. 5, to other ends of the P-channel transistors 41-1, 41-2, . . . , and 41-5, which are opposite to the one ends connected to the power supply, respectively. Likewise, with respect to the P-channel transistors 38-1, 38-2, . . . , and 38-5, the memory cells 11-1, 11-2, . . . , and 11-5 are provided with P-channel transistors 42-1, 42-2, . . . , and 42-5, respectively, each connected to a power supply at one end thereof, gate electrodes of which are connected to the bit bar lines 26-1, 26-2, . . . , and 26-5, respectively. One ends of the P-channel transistors 38-1, 38-2, . . . , and 38-5 are connected to other ends of the P-channel transistors 42-1, 42-2, . . . , and 42-5, which are opposite to the one ends connected to the power supply, respectively. Further, with respect to the N-channel transistors 27-1, 27-2, . . . , and 27-5; and 28-1, 28-2, . . . , and 28-5, likewise, the memory cells 11-1, 11-2, . . . , and 11-5 are provided with N-channel transistors 43-1, 43-2, . . . , and 43-5; 44-1, 44-2, . . . , and 44-5, respectively, each connected to the power supply at one end thereof, gate electrodes of which are connected to the bit lines 23-1, 23-2, . . . , and 23-5, or the bit bar lines 26-1, 26-2, . . . , and 26-5, respectively. The N-channel transistors 27-1, 27-2, . . . , and 27-5; and 28-1, 28-2, . . . , and 28-5 are connected to the N-channel transistors 43-1, 43-2, . . . , and 43-5; and 44-1, 44-2, . . . , and 44-5 are connected, respectively.

Assuming that the memory cell 11-1 stores information of a logic "1", similar to the case of the explanation concerning FIGS. 3 and 4, the output side of the first inverter 20-1 takes a state of a logic "1", and the output side of the second inverter 21-1 takes a state of a logic "0".

It is assumed that a retrieval for a logic "1" is performed for the above-mentioned memory cell 11-1. That is, the bit line 23-1 is enabled with a logic "1", and the bit bar line 26-1 is enabled with a logic "0". While the word line 24 is kept in a state of a logic "0". In this situation, among the N-channel transistors 27-1 and 28-1; and the P-channel transistors 37-1 and 38-1, the N-channel transistor 28-1 and the P-channel transistor 38-1 turn on. And among the P-channel transistors 41-1 and 42-1; and the N-channel transistors 43-1 and 44-1, the P-channel transistor 42-1 and the N-channel transistor 43-1 turn on. Thus, a logic "1" of signal is applied through two P-channel transistors 42-1 and 38-1 to the P-1 point, so that the N-channel transistor 36-1 turns on. That is, when the bit information stored in the memory cell 11-1 and the bit information in the retrieval data entered through the bit line 23-1 and the bit bar line 26-1 are equivalent to each other, the associated transistor 36-1 turns on, similar to the case of the embodiments shown in FIGS. 3 and 4. Further, in this case, since both of two transistors 42-1 and 38-1, each serving as a short circuit between the power supply and the P-1 point, are each a P-channel type, the power supply voltage (5 V) is applied directly to the P-1 point. At that time, even if the match line 14 is precharged, the redundant electric charge on the P-1 point will flow through the P-channel transistor 42-1 and 38-1 to the power supply. As a result, the potential of the P-1 point is kept on the power supply voltage 5 V, without boosting higher than the power supply voltage 5 V.

Assuming that the memory cell 11-2 stores information of a logic "0", the output end of the first inverter 20-2 takes a state of a logic "0", and the output end of the second inverter 21-2 takes a state of a logic "1". In this state, the gate electrode of the transistor 36-1 is shorted with respect to the ground through the N-channel transistors 27-2 and 43-2, so that the gate electrode of the transistor 36-1 takes a state of a logic "0". That is, when the bit information stored in the memory cell 11-2 and the bit information in the retrieval data are not equivalent to each other, the associated transistor 36-2 is kept turning off, similar to the case of the embodiments shown in FIGS. 3 and 4. Thus, in case of the mismatch, the electric charge, which has been precharged on the match line 14, is not discharged. Further, in this case, since both of two transistors 27-2 and 43-2, each serving as a short circuit between the gateelectrode of the transistor 36-2 and the ground, are each of an N-channel type, the ground potential (0 V) is applied directly to the gate electrode of the transistor 36-2. That is, according to the embodiment shown in FIG. 5, similar to the embodiment shown in FIG. 4, the voltage to be applied to the gate electrodes of the transistors 36-1, 36-2, . . . , and 36-5 arranged on the match line 14 swings fully between the power supply potential (5 V) and the ground potential (0 V). Thus, it possible to enhance a margin in the design in comparison with the embodiment shown in FIG. 3.

With respect to the masked bit, as shown concerning the memory cell 11-5, both the bit line 23-5 and the bit bar line 26-5 are enabled with the logic "0".

In this case, the power supply potential (5 V) is applied to the gate electrode of the transistor 36-5 through two P-channel transistors 42-5 and 38-5 or two P-channel transistor 41-5 and 37-5 in accordance with the fact that the memory cell 11-5 has stored logic "0" of information or logic "1" of information, so that the transistor 36-5 turns on in any way. Thus, it is regarded as a match.

Now, let us consider merits and demerits on the associative memories according to the embodiments shown in FIGS. 1, 3, 4 and 5.

According to the associative memory related to the embodiment shown in FIG. 1, it is possible to reduce the number of transistors constituting one memory cell, thereby contributing to a highest integration. On the other hand, as described referring to FIG. 2, it will involve an unexpected boost in potential. Thus, there is a fear that the problem comes to light when the devices are designed by finer rules.

According to the associative memory related to the embodiment shown in FIG. 3, it is possible to reduce the number of transistors constituting one memory cell after that in the associative memory related to the embodiment shown in FIG. 1, thereby contributing to a higher integration to such an extent that it is nearly equal to that in the associative memory related to the embodiment shown in FIG. 1. On the other hand, the potential of the gate electrodes of the transistors 36-1, 36-2, ..., and 36-5 arranged on the match line 14 is limited to the range from the power supply voltage (5 V) to 1.4 V. This causes a margin in design to be lower comparing with that in the associative memories related to the embodiments shown in FIGS. 4 and 5. Further, this does not allow a wide margin for deviation of parts and variation in a power supply voltage.

According to the associative memory related to the embodiment shown in FIG. 4, applied to the gate electrodes of the transistors 36-1, 36-2, ..., and 36-5 arranged on the match line 14 is a voltage which may swing fully between the power supply potential (5 V) and the ground potential (0 V). Thus, it is possible to attain a high margin in design. However, the number of transistors constituting the respective memory cells 11-1, 11-2, ..., and 11-5 increases comparing with that in the associative memory related to the embodiment shown in FIG. 3, whereby it is more difficult to contribute to a high integration than the associative memory related to the embodiment shown in FIG. 3. Further, the number of transistors, which are connected to the bit lines 23-1, 23-2, ..., and 23-5 and the bit bar lines 26-1, 26-2, ..., and 26-5, is also large and thus a load of bit drive circuits is large.

According to the associative memory related to the embodiment shown in FIG. 5, similar to the associative memory related to the embodiment shown in FIG. 4, applied to the gate electrodes of the transistors 36-1, 36-2, ..., and 36-5 arranged on the match line 14 is a voltage which may swing fully between the power supply potential (5 V) and the ground potential (0 V). Thus, it is possible to attain a high margin in design. However, the number of transistors constituting the respective memory cells 11-1, 11-2, ..., and 11-5 increases more than that in the associative memory related to the embodiment shown in FIG. 4, whereby it is more difficult to contribute to a high integration than the associative memory related to the embodiment shown in FIG. 4. However, regarding the transistors for a match detection, which are connected to the bit lines 23-1, 23-2, ..., and 23-5 and the bit bar lines 26-1, 26-2, ..., and 26-5, whose gate electrodes are connected to the bit lines 23-1, 23-2, ..., and 23-5 or the bit bar lines 26-1, 26-2, ..., and 26-5 and thus a load of bit drive circuits is reduced. Further, according to the associative memory related to the embodiment shown in FIG. 5, different from the associative memories related to the embodiments shown in FIGS. 1, 3 and 4, when pairs of the bit lines 23-1, 23-2, ..., and 23-5 and the bit bar lines 26-1, 26-2, ..., and 26-5 each take a state of a logic "0", the associated transistors 36-1, 36-2, ..., and 36-5 arranged on the match line 14 turn on. When the data stored in the word memory 11 is read out, first, all the bit lines 23-1, 23-2, ..., and 23-5 and the bit bar lines 26-1, 26-2, ..., and 26-5 are initialized to take each a state of a logic "1". At that time, the associated transistors 36-1, 36-2, ..., and 36-5 arranged on the match line 14 turn off. Thus, the match line 14 is not precharged even intended. On the other hand, it is necessary for a retrieval to precharge the match line 14. Consequently, if the bit lines 23-1, 23-2, ..., and 23-5 and the bit bar lines 26-1, 26-2, ..., and 26-5 each do not take a state of a logic "0", an initialization (precharge) for the retrieval is not performed. According to the associative memories related to the embodiments shown in FIGS. 1, 3 and 4, both the initialization for the retrieval and the initialization for the data read out are allowed to be performed in the same way. That is, in any of both the cases of initialization, all the bit lines 23-1, 23-2, ..., and 23-5 and the bit bar lines 26-1, 26-2, ..., and 26-5 in pair are precharged to take each a state of a logic "1", whereby it is possible to immediately cope with the subsequent action which is acceptable to be either data read out or data retrieval. On the contrary, according to the associative memory related to the embodiment shown in FIG. 5, different from the associative memories related to the embodiments shown in FIGS. 1, 3 and 4, it is impossible to simultaneously perform the initialization for data read out and the initialization for the retrieval.

The associative memories according to the embodiments shown in FIGS. 1, 3, 4 and 5 have each the merits and demerits as described above.

While the embodiments shown in FIGS. 1, 3, 4 and 5 each show a case in which an N-channel transistor is selected as the first conductivity type transistor referred to in the present invention, it is of course acceptable to select a P-channel transistor as the first conductivity type transistor referred to in the present invention. Further, according to the embodiments of the present invention as described above, one word memory comprises 5 bits. it is noted, however, that the number of bits, which constitutes one word memory, is not restricted to 5 bits and is acceptable to be optionally selected.

The present invention is not limited to the particular embodiments described above. Various changes and modifications may be made within the spirit and scope of the invention.

I claim:

1. An associative memory comprising a word memory adapted to store a word of digital data, a match line associated with said word memory, said match line being arranged to undergo a precharge to a first predetermined potential and a discharge to a second predetermined potential, and a match detection circuit associated with said word memory, said match detection circuit being arranged to output a match signal to the associated match line when a match between the digital data stored in said word memory and an entered retrieval data is detected in a bit pattern of a whole or a specified part of those data, wherein said match detection circuit comprises:

a precharge circuit for precharging said associated match line to the first predetermined potential at the time of a precharge prior to a retrieval; and a discharge circuit for discharging said associated match line to the second predetermined potential when the match is detected at the time of a retrieval.

2. An associative memory according to claim 1, wherein one end of said match line is fixed to the second predetermined potential, said precharge circuit is connected to another end of said match line so that said match line can be precharged from said another end which is on the opposite side of said one end of said match line, and said match detection circuit has a switching circuit provided between the one end and the another end of said match line, said switching circuit being arranged, in the precharge, to electrically disconnect between the one end and the another end of said match line, and in the retrieval, to electrically connect between the one end and the another end of said match line.

3. An associative memory according to claim 2, wherein said switching circuit has a terminal which is directly fixed to the second predetermined potential without passing through any switching elements.

4. An associative memory comprising a word memory adapted to store a word of bit pattern, said word memory having a word of memory cells each for storing one bit, and a match detection circuit associated with said word memory, said match detection circuit being arranged to detect whether or not said associated word memory stores a bit pattern which corresponds to a bit pattern of a whole or a specified part of an entered retrieval data, wherein said memory cells each comprise:

first and second inverters each having an input and an output in which the input of said first inverter is connected with the output of said second inverter, and the input of said second inverter is connected with the output of said first inverter;

a first first conductivity type transistor connected between a bit line and a first node to which the output of said first inverter and the input of said second inverter are connected, a gate of said first first conductivity type transistor being connected to a word line;

a second first conductivity type transistor connected between a bit bar line and a second node to which the output of said second inverter and the input of said first inverter are connected, a gate of said second first conductivity type transistor being connected to the word line;

a third first conductivity type transistor connected to the bit line at one end thereof, a gate of said third first conductivity type transistor being connected to the first node; and a fourth first conductivity type transistor connected between another end of said third first conductivity type transistor and the bit bar line, a gate of said fourth first conductivity type transistor being connected to the second node, and wherein said match detection circuit comprises:

a sense amplifier for detecting charge and discharge at an input end;

a preset circuit for presetting the input end of said sense amplifier to a predetermined first potential;

a plurality of fifth first conductivity type transistors connected in series at the input end of said sense amplifier, a gate of each of said plurality of fifth first conductivity type transistors being connected with a third node to which said third first conductivity type transistor and said fourth first conductivity type transistor are connected in each of said memory cells constituting said word memory associated with said match detection circuit; and a sixth first conductivity type transistor provided between the plurality of fifth first conductivity type transistors or at another end on the opposite side from the input end of said sense amplifier, a gate of said sixth first conductivity type transistor being arranged to receive a control signal for providing such a control that in the present by said preset circuit a disconnecting state is offered, and in the detection for performing said detection a connecting state is offered, thereby controlling a switching between connection and disconnection to a predetermined second potential different from said first potential.

5. An associative memory comprising a word memory adapted to store a word of bit pattern, said word memory having a word of memory cells each for storing one bit, and a match detection circuit associated with said word memory, said match detection circuit being arranged to detect whether or not said associated word memory stores a bit pattern which corresponds to a bit pattern of a whole or a specified part of an entered retrieval data, wherein said memory cells each comprise:

first and second inverters each having an input and an output in which the input of said first inverter is connected with the output of said second inverter, and the input of said second inverter is connected with the output of said first inverter;

a first first conductivity type transistor connected between a bit line and a first node to which the output of said first inverter and the input of said second inverter are connected, a gate of said first first conductivity type transistor being connected to a word line;

a second first conductivity type transistor connected between a bit bar line and a second node to which the output of said second inverter and the input of said first inverter are connected, a gate of said second first conductivity type transistor being connected to the word line;

a first second conductivity type transistor connected to the bit line at one end thereof, a gate of said first second conductivity type transistor being connected to the second node; and a second second conductivity type transistor connected between another end of said first second conductivity type transistor and the bit bar line, a gate of said second second conductivity type transistor being connected to the first node, and wherein said match detection circuit comprises:

a sense amplifier for detecting charge and discharge at an input end;

a preset circuit for presetting the input end of said sense amplifier to a predetermined first potential;

a plurality of third first conductivity type transistors connected in series at the input end of said sense amplifier, a gate of each of said plurality of third first conductivity type transistors being connected with a third node to which said first second conductivity type transistor and said second second conductivity type transistor are connected in each of said memory cells constituting said word memory associated with said match detection circuit;

a fourth first conductivity type transistor and a third second one conductivity type transistor, one end of one of these transistors being maintained at a predetermined second potential different from said first potential, one end of another of these transistors being connected with said third first conductivity type transistor which is connected on a point at the longest distance from said sense amplifier, these transistors being connected with each other, a gate of said fourth first conductivity type transistor being connected with a control line through which a control signal is transmitted to provide such a control that in the present by said present circuit a disconnecting state is offered, and in the detection for performing said detection a connecting state is offered, said third second conductivity type transistor being arranged to form a diode through a diode-connection.

6. An associative memory comprising a word memory adapted to store a word of bit pattern, said word memory having a word of memory cells each for storing one bit, and a match detection circuit associated with said word memory, said match detection circuit being arranged to detect whether or not said associated word memory stores a bit pattern which corresponds to a bit pattern of a whole or a specified part of an entered retrieval data, wherein said memory cells each comprise:

first and second inverters each having an input and an output in which the input of said first inverter is connected with the output of said second inverter, and the input of said second inverter is connected with the output of said first inverter;

a first first conductivity type transistor connected between a bit line and a first node to which the output of said first inverter and the input of said second inverter are connected, a gate of said first first conductivity type transistor being connected to a word line;

a second first conductivity type transistor connected between a bit bar line and a second node to which the output of said second inverter and the input of said first inverter are connected, a gate of said second first conductivity type transistor being connected to the word line;

a third first conductivity type transistor connected to the bit line at one end thereof, a gate of said third first conductivity type transistor being connected to the first node;

a fourth first conductivity type transistor connected between another end of said third first conductivity type transistor and the bit bar line, a gate of said fourth first conductivity type transistor being connected to the second node, a first second conductivity type transistor connected to the bit line at one end thereof, a gate of said first second conductivity type transistor being connected to the second node; and a second second conductivity type transistor connected between another end of said first second conductivity type transistor and the bit bar line, a gate of said second second conductivity type transistor being connected to the first node, and wherein said match detection circuit comprises:

a sense amplifier for detecting charge and discharge at an input end;

a preset circuit for presetting the input end of said sense amplifier to a predetermined first potential;

a plurality of fifth first conductivity type transistors connected in series at the input end of said sense amplifier, a gate of each of said plurality of fifth first conductivity type transistors being connected with both a third node to which said third first conductivity type transistor and said fourth first conductivity type transistor are connected and a fourth node to which said first second conductivity type transistor and said second second conductivity type transistor are connected in each of said memory cells constituting said word memory associated with said match detection circuit; and a sixth first conductivity type transistor provided between the plurality of fifth first conductivity type transistors or at another end on the opposite side from the input end of said sense amplifier, a gate of said sixth first conductivity type transistor being arranged to receive a control signal for providing such a control that in the present by said preset circuit a disconnecting state is offered, and in the detection for performing said detection a connecting state is offered, thereby controlling a switching between connection and disconnection to a predetermined second potential different from said first potential.

7. An associative memory comprising a plurality of word memories each adapted to store a word of bit pattern, said word memory having a word of memory cells each for storing one bit, and a plurality of match detection circuits associated with said plurality of word memories, respectively, said match detection circuit being arranged to detect whether or not said associated word memory stores a bit pattern which corresponds to a bit pattern of a whole or a specified part of an entered retrieval data, wherein said memory cells each comprise:

first and second inverters each having an input and an output in which the input of said first inverter is connected with the output of said second inverter, and the input of said second inverter is connected with the output of said first inverter;

a first first conductivity type transistor connected between a bit line and a first node to which the output of said first inverter and the input of said second inverter are connected, a gate of said first first conductivity type transistor being connected to a word line;

a second first conductivity type transistor connected between a bit bar line and a second node to which the output of said second inverter and the input of said first inverter are connected, a gate of said second first conductivity type transistor being connected to the word line;

a first second conductivity type transistor one end of which is maintained at a predetermined first potential, a gate of said first second conductivity type transistor being connected to the bit line;

a second second conductivity type transistor one end of which is connected with another end of said first second conductivity type transistor, a gate of said second second conductivity type transistor being connected to the first node;

a third second conductivity type transistor one end of which is connected with another end of said second second conductivity type transistor, a gate of said third second conductivity type transistor being connected to the second node;

a fourth second conductivity type transistor one end of which is connected with another end of said third second conductivity type transistor, another end is maintained at the predetermined first potential, a gate of said fourth second conductivity type transistor being connected to the bit bar line;

a third first conductivity type transistor one end of which is maintained at a predetermined second potential different from the predetermined first potential, a gate of said third first conductivity type transistor being connected to the bit line;

a fourth first conductivity type transistor one end of which is connected with another end of said third first conductivity type transistor, a gate of said fourth first conductivity type transistor being connected to the second node;

a fifth first conductivity type transistor one end of which is connected with another end of said fourth first conductivity type transistor, a gate of said fifth first conductivity type transistor being connected to the first node; and a sixth first conductivity type transistor one end of which is connected with another end of said fifth first conductivity type transistor, another end is maintained at the predetermined second potential, a gate of said sixth first conductivity type transistor being connected to the bit bar line;

wherein said match detection circuits each comprise:

a sense amplifier for detecting charge and discharge at an input end;

a preset circuit for presetting the input end of said sense amplifier to a predetermined first potential;

a plurality of seventh first conductivity type transistors connected in series at the input end of said sense amplifier, a gate of each of said plurality of seventh first conductivity type transistors being connected with both a third node to which said second second conductivity type transistor and said third second conductivity type transistor are connected and a fourth node to which said fourth first conductivity type transistor and said fifth first conductivity type transistor are connected in each of said memory cells constituting said word memory associated with said match detection circuit; and an eighth first conductivity type transistor provided between the plurality of seventh first conductivity type transistors or at another end on the opposite side from the input end of said sense amplifier, a gate of said eighth first conductivity type transistor being arranged to receive a control signal for providing such a control that in the present by said preset circuit a disconnecting state is offered, and in the detection for performing said detection a connecting state is offered, thereby controlling a switching between connection and disconnection to a predetermined second potential different from said first potential.

* * * * *